United States Patent
Miao

(10) Patent No.: US 9,512,522 B2
(45) Date of Patent: *Dec. 6, 2016

(54) METHOD OF METALIZING SURFACE AND ARTICLE OBTAINABLE

(71) Applicants: SHENZHEN BYD AUTO R&D COMPANY LIMITED, Shenzhen, Guangdong (CN); BYD COMPANY LIMITED, Shenzhen, Guangdong (CN)

(72) Inventor: Weifeng Miao, Guangdong (CN)

(73) Assignees: SHENZHEN BYD AUTO R&D COMPANY LIMITED, Shenzhen (CN); BYD COMPANY LIMITED, Shenzhen (CN)

(*) Notice: Subject to any disclaimer, the term of this patent is extended or adjusted under 35 U.S.C. 154(b) by 3 days.

This patent is subject to a terminal disclaimer.

(21) Appl. No.: 14/315,166

(22) Filed: Jun. 25, 2014

(65) Prior Publication Data
US 2014/0308450 A1 Oct. 16, 2014

Related U.S. Application Data

(63) Continuation of application No. PCT/CN2012/087588, filed on Dec. 26, 2012.

(30) Foreign Application Priority Data

Dec. 27, 2011 (CN) .......................... 2011 1 0442484

(51) Int. Cl.
| | |
|---|---|
| C23C 18/18 | (2006.01) |
| C25D 5/02 | (2006.01) |
| C23C 18/20 | (2006.01) |
| C23C 18/16 | (2006.01) |
| H05K 1/09 | (2006.01) |
| H05K 3/24 | (2006.01) |
| C23C 28/00 | (2006.01) |
| C09D 11/037 | (2014.01) |
| C09D 11/322 | (2014.01) |
| C09D 11/52 | (2014.01) |
| H05K 3/18 | (2006.01) |

(52) U.S. Cl.
CPC .......... *C23C 18/1882* (2013.01); *C09D 11/037* (2013.01); *C09D 11/322* (2013.01); *C09D 11/52* (2013.01); *C23C 18/165* (2013.01); *C23C 18/1608* (2013.01); *C23C 18/1639* (2013.01); *C23C 18/1865* (2013.01); *C23C 18/1879* (2013.01); *C23C 18/206* (2013.01); *C23C 18/2033* (2013.01); *C23C 28/00* (2013.01); *C25D 5/02* (2013.01); *H05K 1/097* (2013.01); *H05K 3/246* (2013.01); *H05K 3/18* (2013.01); *H05K 2203/1105* (2013.01)

(58) Field of Classification Search
None
See application file for complete search history.

(56) References Cited

U.S. PATENT DOCUMENTS

| | | | | |
|---|---|---|---|---|
| 3,615,731 A * | 10/1971 | Short | .......................... | 106/1.21 |
| 6,537,359 B1 * | 3/2003 | Spa | .......................... | 106/31.92 |
| 2003/0185971 A1 * | 10/2003 | Saksa et al. | .................... | 427/96 |
| 2009/0246357 A1 * | 10/2009 | Liou et al. | .................... | 427/97.3 |

FOREIGN PATENT DOCUMENTS

| | | | |
|---|---|---|---|
| CN | 101547567 A | | 9/2009 |
| CN | 102071411 A | | 5/2011 |
| CN | 102206817 A | * | 10/2011 |
| JP | 2000-264761 A | | 9/2000 |
| JP | 2006-052101 A | | 2/2006 |
| JP | 2011-503348 A | | 1/2011 |
| WO | WO 2011/072506 A1 | | 6/2011 |
| WO | WO 2011/103755 A1 | | 9/2011 |
| WO | WO 2013/097728 A1 | | 7/2013 |

OTHER PUBLICATIONS

Machine-Generated English Translation of CN 102206817 A to Chen D et al.; Oct. 2011.*
PCT International Search Report mailed Apr. 4, 2013, issued in International Application No. PCT/CN2012/087588 (4 pages).

* cited by examiner

*Primary Examiner* — Michael P Rodriguez

(57) ABSTRACT

A mthod of metalizing a surface of an insulation substrate includes: applying an ink composition onto the surface to form an ink layer; subjecting the insulation substrate to heat treatment at a temperature of about 500 to 1000 degrees Celsius in a non-reactive atmosphere; plating a metal layer on the ink layer. The ink composition comprises a metal compound and an ink vehicle. The metal compound includes at least one selected from a group consisting of a nano-copper oxide, a nano-cuprous oxide, a compound of formula I, and a compound of formula II, $TiO_{2-o}$(I), $M^1M^2_pO_q$ (II), $0.05 \leq o < 1.8$, where, $M^1$ is at least one element selected from a group consisting of groups 2, 9-12 of the periodic table, $M^2$ is at least one element selected from a group consisting of groups 3-8, 10 and 13 of the periodic table, $0 < p \leq 2$, and $0 < q < 4$.

20 Claims, No Drawings

METHOD OF METALIZING SURFACE AND ARTICLE OBTAINABLE

CROSS-REFERENCE TO RELATED APPLICATION

This application is a continuation application of International Application No. PCT/CN2012/087588, filed on Dec. 26, 2012, which claims priority to and benefits of Chinese Patent Application Serial No. 201110442484.1, filed with the State Intellectual Property Office (SIPO) of P. R. China on Dec. 27, 2011. The entire contents of the above-mentioned applications are incorporated herein by reference.

FIELD

The present disclosure relates to the field of material science, more particularly to a method of metalizing a surface of an insulation substrate, and an article obtainable by the method.

BACKGROUND

The statements in this section merely provide background information related to the present disclosure and may not constitute prior art.

A metallic layer can be formed on an insulation substrate surface as an electromagnetic signal transduction pathway, which has been applied in the fields of such as automobile, computer and communication. Plenty of means may be used to form the metallic layer on the surface of an insulation substrate surface, for example plastic.

However, the means for metalizing a surface of an insulation substrate needs to be further improved.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In viewing thereof, the present disclosure is directed to solve at least one of the problems existing in the art. Accordingly, means of metalizing a surface of an insulation substrate may be provided. An adhesion force of a metal layer plated on an inorganic substrate surface (such as a ceramic substrate, a glass substrate and a cement substrate, etc.) to the substrate may be improved.

According to a first aspect of the present disclosure, there is provided a method of metalizing a surface of an insulation substrate. The method may comprise the steps of: applying an ink composition onto a surface to be metalized of the insulation substrate, obtaining an insulation substrate with an ink layer; subjecting the insulation substrate with an ink layer to heat treatment at a temperature of about 500 to 1000 degrees Celsius in an non-reactive atmosphere; plating at least one metal layer on the ink layer, the ink composition comprising a metal compound and an ink vehicle, the metal compound including at least one selected from a group consisting of a nano-copper oxide, a nano-cuprous oxide, a compound of formula I and a compound of formula II:

$$TiO_{2-\sigma} \quad (I),$$

$$M^1M^2_pO_q \quad (II),$$

where, in the above formula I $0.05 \leq \sigma < 1.8$, $M^1$ includes at least one element selected from a group consisting of groups 2, 9-12 of the periodic table according to IUPAC (International Union of Pure and Applied Chemistry) nomenclature, $M^2$ includes at least one element selected from a group consisting of groups 3-8, 10 and 13 of the periodic table according to IUPAC nomenclature, and $0 < p \leq 2$, and $0 < q < 4$.

According to a second aspect of the present disclosure, there is provided an article having a metallic surface, prepared according to the method of the present disclosure.

The metal layer formed according to the method of the present disclosure may have a strong adhesion force to the substrate; thereby it may be possible to obtain a solid and reliable signaling pathway. In addition, the method of the present disclosure may provide a higher plating rate to form the metal layer on the substrate surface, and thus production efficiency according to the method of the present disclosure is high. Besides, compared with the commonly-used conductive precious metal (such as silver), the source of the conductive metal compound in the ink composition of the present disclosure is abroad with a lower price, which may significantly reduce the production cost of signal transduction component.

Additional aspects and advantages of embodiments of present disclosure will be given in part in the following descriptions, become apparent in part from the following descriptions, or be learned from the practice of the embodiments of the present disclosure.

DETAILED DESCRIPTION

According to a first aspect of the present disclosure, there is provided a method of metalizing a surface of an insulation substrate. The method may comprise the steps of: applying an ink composition onto a surface to be metalized of the insulation substrate, obtaining an insulation substrate with an ink layer; subjecting the insulation substrate with an ink layer to heat treatment at a temperature of about 500 to 1000 degrees Celsius in a non-reactive atmosphere; and plating at least one metal layer on the ink layer.

According to the method of present disclosure, the ink composition may contain a metal compound and an ink vehicle.

In the present disclosure the metal compound is at least one selected from a group consisting of a nano-copper oxide, a nano-cuprous oxide, a compound of formula I and a compound of formula II, $$TiO_{2-\sigma} \quad (I),$$

$$M^1M^2_pO_q \quad (II),$$

where, in the above formula I or formula II, $0.05 \leq \sigma < 1.8$, preferably $\sigma$ is about 0.1 to 1.5, more preferably $\sigma$ is about 0.2 to 1.2, $M^1$ may be at least one element selected from a group consisting of groups 2, 9-12 of the periodic table according to IUPAC nomenclature, $M^2$ may be at least one element selected from a group consisting of groups 3-8, 10 and 13 of the periodic table according to IUPAC nomenclature, $0 < p \leq 2$, and $0 < q < 4$ (for example in one example of the present disclosure, q may be 1 to 3.98).

In one embodiment of present disclosure, specific examples of $M^1$ may be but not limited to at least one of Mg, Ca, Sr, Ba, Co, Ni, Cu and Zn, and specific examples of $M^2$ may be but not limited to at least one of Sc, Y, Ti, Zr, Hf, V, Nb, Ta Cr, Mo, W, Mn, Fe, Ru, B, Al, Ga and In.

For the compound of formula II, in one embodiment of the present disclosure, $M^1$ is one element selected from a group consisting of group 11 of the periodic table according to IUPAC nomenclature, such as Cu; $M^2$ is one element selected from a group consisting of group 8 of the periodic table according to IUPAC nomenclature, such as Fe or Ru.

In one embodiment of present disclosure, the compound of formula II is a compound of formula III, $$CuFeO_{4-\delta} \quad (III),$$

where, in the above formular III, $0<\delta\leq3$, preferably $\delta$ may be about 0.01-2, more preferably, $\delta$ may be about 0.02-1.

For the compound of formula II, in one embodiment of the present disclosure, $M^1$ is one element selected from a group consisting of group 11 of the periodic table according to IUPAC nomenclature, such as Cu; and $M^2$ may comprise $M^{21}$ and $M^{22}$, $M^{21}$ is one element selected from a group consisting of group 8 of the periodic table according to IUPAC nomenclature, such as Fe or Ru, $M^{22}$ is at least one element selected from a group consisting of groups 13 and 7 of the periodic table according to IUPAC nomenclature, such as at least one selected from Mn, B, Al, Ga, and In. In one embodiment of the present disclosure, the molar ratio between $M^1$ and $M^2$ bay be about 1:1, and the molar ratio between $M^{21}$ and $M^{22}$ may be about 1:0.1-10, preferably the molar ratio between $M^{21}$ and $M^{22}$ may be 1:0.5-5, more preferably the molar ratio between $M^{21}$ and $M^{22}$ may be 1:0.5-3, and further preferably the molar ratio between $M^{21}$ and $M^{22}$ may be 1:1-3.

In one embodiment of the present disclosure, $M^{22}$ may be one element selected from a group consisting of group 13 of the periodic table according to IUPAC nomenclature (for example $M^{22}$ may be B, Al, Ga, and In); $M^{22}$ may also be one element selected from a group consisting of group 7 of the periodic table according to IUPAC nomenclature (for example $M^{22}$ may be Mn); and $M^{22}$ may also be one element selected from a group consisting of group 13 and one element selected from a group consisting of group 7 of the periodic table according to IUPAC nomenclature (for example $M^{22}$ may be Al and Mn). In one embodiment of the present disclosure, $M^{22}$ comprises $M^{221}$ and $M^{222}$, and $M^{221}$ is one element selected from a group consisting of group 13 of the periodic table according to IUPAC nomenclature, and $M^{222}$ is one element selected from a group consisting of group 7 of the periodic table according to IUPAC nomenclature, The molar ratio between $M^{221}$ and $M^{222}$ may be about 1:0.1-10, and preferably may be 1:0.5-2. In one embodiment of the present disclosure, $M^{22}$ preferably may be one element selected from a group consisting of group 7 of the periodic table according to IUPAC nomenclature (for example $M^{22}$ may be Mn), when forming the ink layer on the substrate using the ink composition prepared by the metal compound, and further plating the metal on the surface of the ink layer, and a higher plating velocity may be obtained.

In one embodiment of the present disclosure, examples of compound of formula II comprise but not limited to at least one selected from $CuFe_{0.5}Mn_{0.5}O_{2.5}$, $CuFe_{0.5}Al_{0.5}O_{2.5}$ and $CuFe_{0.5}Al_{0.25}Mn_{0.5}O_{2.5}$, preferably is $CuFe_{0.5}Mn_{0.5}O_{2.5}$.

For the compound of formula II, in one embodiment of the present disclosure, $M^1$ is one element selected from a group consisting of group 2 of the periodic table according to IUPAC nomenclature. For example $M^1$ may be Mg, Ca, Sr, or Ba; and $M^2$ is one element selected from a group consisting of group 13 of the periodic table according to IUPAC nomenclature. For example $M^2$ may be B, Al, Ga or In.

In one embodiment of the present disclosure, preferably the compound is a compound of formula IV, $$MgGa_2O_{4-\lambda} \quad (IV),$$

where, in the above formula IV, $0<\lambda\leq3$, $\lambda$ preferably is 0.01-2, more preferably is 0.1-1, and further preferably is 0.1-0.5.

For the compound of formula II, in one embodiment of the present disclosure, $M^1$ is one element selected from a group consisting of group 10 of the periodic table according to IUPAC nomenclature For example $M^1$ may be Ni; and $M^2$ is one element selected from a group consisting of group 6 of the periodic table according to IUPAC nomenclature. For example $M^2$ may be Cr, Mo, or W.

In one embodiment of the present disclosure, preferably the compound is a compound of formula V, $$NiMoO_{4-\mu} \quad (V),$$

where, in the above formula V, $0<\mu\leq3$, preferably $\mu$ is 0.01-2, more preferably is 0.1-1, and further preferably is 0.2-0.5.

For the compound of formula II, in one embodiment of the present disclosure, $M^1$ is one element selected from a group consisting of group 11 of the periodic table according to IUPAC nomenclature, for example Cu; and $M^2$ is at least one element selected from a group consisting of group 13 of the periodic table according to IUPAC nomenclature, and $M^2$ comprises at least one element selected from a group consisting of group 13 of the periodic table according to IUPAC nomenclature and at least one element selected from a group consisting of groups 8 and 10 of the periodic table according to IUPAC nomenclature. In this preferred embodiment, the molar ratio between $M^1$ and $M^2$ preferably is 1:0.5-1.

In one embodiment of the present disclosure, $M^2$ comprises at least one element selected from a group consisting of group 13 of the periodic table according to IUPAC nomenclature and at least one element selected from a group consisting of groups 8 and 10 of the periodic table according to IUPAC nomenclature, and $M^2$ comprises $M^{23}$ and $M^{24}$. $M^{23}$ is one element selected from a group consisting of groups 8, 10 and 13 of the periodic table according to IUPAC nomenclature, for example $M^{23}$ may be Ga, or Ga and at least one element selected from Fe and Ni; $M^{24}$ is one element selected from a group consisting of group 13 of the periodic table according to IUPAC nomenclature, preferably is B. In this preferred embodiment, when both $M^{23}$ and $M^{24}$ are one element selected from a group consisting of group 13 of the periodic table according to IUPAC nomenclature. $M^{23}$ and $M^{24}$ are different elements. The molar ratio between $M^{23}$ and $M^{24}$ may be 1:0.1-10, preferably is 1:0.5-2, more preferably is 0.5-1.5, and further preferably is 1:1.

In one embodiment of the present disclosure, examples of the compound of formula II contain but not limited to at least one selected from $CuFe_{0.5}B_{0.5}O_{2.5}$, $CuNi_{0.5}B_{0.5}O_{2.5}$, $CuGa_{0.5}B_{0.5}O_{2.5}$ and $Cu\ B_{0.7}O_2$.

For the compound of formula II, in one embodiment of the present disclosure, the compound is a compound of formula VI, $$Ca_\alpha Cu_{1-\alpha}TiO_{3-\beta} \quad (VI),$$

where, in the above formula VI, $0\leq\alpha<1$ and $\beta$ is about 0-2, preferably $\alpha$ is 0.05-0.5, more preferably $\alpha$ is 0.1-0.25;

preferably $\beta$ is 0.01-2, more preferably $\beta$ is 0.01-0.5, and further preferably $\beta$ is 0.05-0.4.

In one embodiment of the present disclosure, the nano-cuprous oxide refers to a cuprous oxide having a particle size of less than 1 µm; the nano-copper oxide refers to a copper oxide having particle size of less than 1 µm.

In one embodiment of the present disclosure, the metal compound preferably is at least one selected from nano-cuprous oxide, nano-copper oxide, compound of formula I, the compound of above formula III, $CuFe_{0.5}Mn_{0.5}O_{2.5}$, $CuFe_{0.5}Al_{0.5}O_{2.5}$, $CuFe_{0.5}Al_{0.25}Mn_{0.5}O_{2.5}$, the compound of above formula IV, the compound of above formula V, $CuFe_{0.5}B_{0.5}O_{2.5}$, $CuNi_{0.5}B_{0.5}O_{2.5}$, $CuGa_{0.5}B_{0.5}O_{2.5}$, $CuB_{0.7}O_2$, and the compound of above formula VI.

Although the objectives of the present disclosure may be achieved by using the above metal compounds, the inventor of the present disclosure has found out that, when the metal compound is at least one selected from following compounds, forming the ink layer on the substrate surface by using the ink composition containing the metal compound and subsequently planting the metal layer, it may obtain a higher plating velocity (especially by using electronic plating method):

(1) Nano-cuprous oxide and nano-copper oxide;

(2) Compound of formula I;

(3) The compound of formula II, in which $M^1$ is one element selected from a group consisting of group 11 of the periodic table according to IUPAC nomenclature, and $M^2$ is one element selected from a group consisting of group 8 of the periodic table according to IUPAC nomenclature;

(4) The compound of formula II, in which $M^1$ is one element selected from a group consisting of group 11 of the periodic table according to IUPAC nomenclature; $M^2$ comprises $M^{21}$ and $M^{22}$, $M^{21}$ is one element selected from a group consisting of group 8 of the periodic table according to IUPAC nomenclature, and $M^{22}$ is at least one element selected from a group consisting of groups 13 and 7 of the periodic table according to IUPAC nomenclature (preferably $M^{22}$ is one element selected from a group consisting of group 7 of the periodic table according to IUPAC nomenclature);

(5) The compound of formula II, in which $M^1$ is one element selected from a group consisting of group 11 of the periodic table according to IUPAC nomenclature, $M^2$ is at least one element selected from a group consisting of group 13 of the periodic table according to IUPAC nomenclature, and $M^2$ comprises at least one element selected from a group consisting of group 13 of the periodic table according to IUPAC nomenclature and at least one element selected from a group consisting of groups 8 and 10 of the periodic table according to IUPAC nomenclature; and (6) The compound of formula VI (eg. $Ca_\alpha Cu_{1-\alpha}TiO_{3-\beta}$).

To further improve the plating velocity, the metal compound is at least one selected from the following compounds:

(1) Nano-cuprous oxide and nano-copper oxide;

(2) Compound of formula I (eg. $TiO_{2-o}$);

(3) The compound of formula II, in which $M^1$ is one element selected from a group consisting of group 11 of the periodic table according to IUPAC nomenclature, $M^2$ is one element selected from a group consisting of group 8 of the periodic table according to IUPAC nomenclature;

(4) The compound of formula II, in which $M^1$ is one element selected from a group consisting of group 11 of the periodic table according to IUPAC nomenclature; $M^2$ comprises $M^{21}$ and $M^{22}$, $M^{21}$ is one element selected from a group consisting of group 8 of the periodic table according to IUPAC nomenclature, and $M^{22}$ is at least one element selected from a group consisting of group 7 of the periodic table according to IUPAC nomenclature; and (5) The compound of formula VI (eg. $Ca_\alpha Cu_{1-\alpha}TiO_{3-\beta}$).

More preferably, the metal compound is at least one selected from the following compounds:

(1) Nano-cuprous oxide and nano-copper oxide;

(2) Compound of formula I (eg. $TiO_{2-o}$);

(3) The compound of formula II, in which $M^1$ is one element selected from a group consisting of group 11 of the periodic table according to IUPAC nomenclature, $M^2$ is one element selected from a group consisting of group 8 of the periodic table according to IUPAC nomenclature;

(4) The compound of formula VI (eg. $Ca_\alpha Cu_{1-\alpha}TiO_{3-\beta}$).

Further preferably, the metal compound is at least one selected from nano-cuprous oxide, nano-copper oxide, the compound of formula I (eg. $TiO_{2-o}$) and the compound of formula III (eg. $CuFeO_{4-\delta}$), which may obtain improved higher plating velocity.

In addition, the inventor of the present disclosure has found out that, when the metal compound of the ink compositon is at least one selected from the following compounds, the signal pathway, formed through forming the ink layer on the substrate surface by using the ink composition, and plating the metal layer by the method of the present disclosure, may have a higher signal sensitivity: (1) nano-cuprous oxide and nano-copper oxide; (2) compound of formula I (eg. $TiO_{2-o}$); (3) the compound of formula II in which $M^1$ is one element selected from a group consisting of group 10 of the periodic table according to IUPAC nomenclature, and $M^2$ is one element selected from a group consisting of group 6 of the periodic table according to IUPAC nomenclature.

To further improve the signal sensitivity, the metal compound is at least one selected from the following compounds: (1) nano-cuprous oxide and nano-copper oxide; (2) the compound of formula I (eg. $TiO_{2-o}$); and (3) the compound of formula V (eg. $NiMoO_{4-\mu}$). Further preferably, the metal compound is at least one selected from nano-cuprous oxide and nano-copper oxide and compound of formula I (eg. $TiO_{2-o}$).

In one embodiment of the present disclosure, the average particle size of the metal compound may be properly selected in accordance with specific application. Generally, the metal compound has an average particle size of less than 1 µm. Preferably, the metal compound has an average particle size of about 1-500 nm. More preferable, the metal compound has an average particle size of about 1-100 nm. When the average particle size of the metal compound is within the range of about 1-100 nm, the method according to the present disclosure is particular suitable for the method of an ink-jet printing method or a laser printing method to apply the ink composition onto the substrate surface, which may obtain higher production efficiency; and the metal layer has a higher adhesion force to the substrate, as well as a finer ink pattern is obtained, thereby a line having a higher accuracy is further obtained. In one embodiment of the present disclosure, various commonly-used methods in the art may be used to make the average particle size of the metal compound within the recited range. For example, a grinding method may be used to make the average particle size of the metal compound within the recited range. The grinding method is well-known in the art which do not need to repeat.

In one embodiment of the present disclosure, the average particle size may be measured by using a static laser tester, and the average particle size is volume average particle size.

In one embodiment of the present disclosure, the metal compound may be commercially available. For example, the nano-copper oxide and nano-cuprous oxide may be commercially available from Aladdin Chemical Reagent Company; compound of formula may be titanium black commercially available from Korea Bo Kwang Chemical Company under a trademark of Tilox.

In one embodiment of the present disclosure, the metal compound may also be prepared by a conventional method in the art.

In one embodiment of the present disclosure, for the compound of formula I, titanium dioxide is subjected to calcination in a $NH_3$ atmosphere to prepare the compound of formula I. Temperature and time of calcination may be properly selected in accordance with σ value in formula I. Generally, the temperature of the calcination may be 730-830 degrees Celsius, the time of the calcination may be about 2.5-6 hours. Preferably, the $NH_3$ is continuous charged into a container having titanium dioxide, the flow velocity of the $NH_3$ may be 2-6 cm$^3$/s.

In one embodiment of the present disclosure, for the compound of formula II, $M^1$ oxide or $M^1$ carbonate (in $M^1$ oxide, the molar ratio between $M^1$ and O is $$\frac{2}{m^1} : 1,$$

$m^1$ is the valence of $M^1$) and $M^2$ oxide (in $M^2$ oxide, the molar ratio between $M^2$ and O is $$\frac{2}{m^2} : 1,$$

$m^2$ is the valence of $M^2$) are evenly mixed to form a mixture, the mixture is subjected to calcination in a non-reactive atmosphere or a reducing atmosphere to obtain a metal compound (e.g., $M^1 M^2_p O_q$).

The amounts of $M^1$ oxide or $M^1$ carbonate and $M^2$ oxide are properly selected to make the molar ratio between $M^1$ and $M^2$ being 1: p in the obtained metal compound.

In particular, for the compound of formula III, it may mix copper oxide and iron oxide to form a mixture, and the mixture may be subjected to calcination in a non-reactive atmosphere or a reducing atmosphere to obtain the compound of formula III (e.g., $CuFeO_{4-\delta}$). For compound of formula IV, the compound may be obtained by the steps of:
mixing magnesium oxide and gallium oxide evenly to form a mixture; and
subjecting the resulting mixture to calcination in the non-reactive atmosphere or the reducing atmosphere to obtain the compound of formula IV (e.g., $MgGa_2O_{4\lambda}$).

For the compound of formula V, the compound may be obtained by the steps of:
mixing nickel oxide and molybdenum oxide evenly to form a mixture, and
subjecting the resulting mixture to calcination in the non-reactive atmosphere or the reducing atmosphere to obtain the compound of formula V (e.g., $NiMoO_{4-\mu}$).

For the compound of formula VI, the compound may be obtained by the steps of:
mixing calcium carbonate, copper oxide and titanium oxide evenly to form a mixture; and
subjecting the resulting mixture to calcination in the non-reactive atmosphere or the reducing atmosphere to obtain the compound of formula VI (e.g., $Ca_\alpha Cu_{1-\alpha} TiO_{3-\beta}$).

In one embodiment of the present disclosure, the temperature of the calcination may be about 500 to 1000 degrees Celsius, and the time of the calcination may be about 1 to 12 hours.

In one embodiment of the present disclosure, the non-reactive atmosphere refers to a gas which may not chemically interact with reactants and reaction products during the calcination process, for example: nitrogen and the gas of Group Zero (such as argon). In one embodiment of the present disclosure, the reducing atmosphere may be an atmosphere comprising a mixture of hydrogen and non-reactive gas, in which the hydrogen concentration may be conventionally selected in the art.

In one embodiment of the present disclosure, the ink composition may also comprise an ink vehicle. When applying the ink composition on the surface of the insulation substrate, the ink vehicle may play a role of making the metal compound dispersed on the insulation substrate surface evenly and forming a layer having a certain strength and a certain adhesion force to the insulation substrate.

The present disclosure has no special restriction to the type of the ink vehicle, as long as the ink vehicle selected may play the above roles. Preferably, the ink vehicle is organic binder. More preferably, the ink vehicle is at least one selected from a group consisting of cellulose acetate, polyacrylate-based resin, ethylene-vinyl acetate copolymer, polyvinyl alcohol, polyvinyl acetal, polyvinyl acetate, polyvinyl pyrrolidone, and polyphosphonic acid.

In one embodiment of the present disclosure, the ink vehicle may be commercially available from Eastman Company, USA, CAB Series cellulose aceto butyrate (for example: cellulose aceto butyrate under a trademard of CAB381-0.5, CAB381-20 of CAB551-0.2 and CAB381-2), may be commercially available from Kuraray Co., Ltd., Japan, Mowital series polyvinyl butyral (for example: polyvinyl butyral under a trademark of Mowital B of 60T, Mowital B 75H and Mowital B 60H).

In one embodiment of the present disclosure, the relative ratio between the ink vehicle and the metal compound may make the metal compound being dispersed on the surface of the insulation substrate evenly, and form the ink layer having a certain strength and a certain adhesion force to the insulation substrate, and may plate the metal layer onto the ink layer. Generally, in one embodiment of the present disclosure, based on 100 weight parts of the metal compound, the amount of the ink vehicle may be about 1-30 weight parts. Preferably the amount of the ink vehicle may be about 1.5 to 15 weight parts.

In one embodiment of the present disclosure, to further improve the uniformity of the metal compound dispersing in the ink vehicle and to form more even film on the surface of the insulation substrate, the ink composition preferably also comprises a solvent. The ink composition of the present disclosure has no special restriction to the type of the solvent; it may be conventionally selected in the art. Preferably, the solvent is at least one selected from a group consisting of $H_2O$, $C_1$-$C_{12}$ alcohol, $C_3$-$C_{12}$ ketone, $C_6$-$C_{12}$ arene, $C_1$-$C_{12}$ alkyl halide and $C_2$-$C_{12}$ olefin halide. Specifically, the solvent may be at least one selected from the group consisting of methanol, ethanol, n-propanol, isopropanol, n-butanol, tert-butanol, n-pentanol, n-hexanol, n-heptanol, n-octanol, acetone, 2-n-amyl ketone, 2-n-butanone, 3-methyl-2-pentanone, 2,3-butanedione, 2,3-pentanedione, 2,5-hexanedione, 1,3-cyclohexanedione, toluene, xylene and trichloroethylene.

According to an embodiment of the present disclosure, there is no special restriction to the amount of solvent, and it may be any conventional usage amount in the art. To ensure that the metal compound can be dispersed in the ink vehicle evenly and formed into a layer of film on the insulation substrate surface, based on 100 weight parts of the metal compound, the content of the solvent is about 20 to 200 weight parts, preferably is about 30 to 100 weight parts.

In one embodiment of the present disclosure, the ink composition may also contain various commonly-used auxiliary agents in accordance with specific application to give the ink composition a specific performance or functionality. Preferably, the auxiliary agent contains at least one selected from a group of dispersant, defoamer, flatting agent and viscosity modifier.

The usage amount of the auxiliary agent may be a conventional selection in the art. Preferably, based on 100 weight parts of the metal compound, the total amount of the auxiliary agent may be about 0.1 to 20 weight parts, preferably about 0.5-10 weight parts.

In one embodiment of the present disclosure, the dispersant is used to shorten time of dispersing the metal compound in the ink vehicle and optional solvent, and to improve the dispersion stability of the metal compound in the ink vehicle and optional solvent. The dispersants may be various commonly-used substances in the art which can achieve the above function. For example, the dispersant may be commonly-used organic dispersants in the art, such as aliphatic amine dispersant, alcohol amine dispersant, cyclic unsaturated amine dispersant, fatty acid dispersant, aliphatic amide dispersant, ester dispersant, paraffin dispersant, phosphate dispersant, polymeric dispersant (for example, acrylate dispersant and polyester dispersant) and organic phosphonic dispersant.

In one embodiment of the present disclosure, the dispersants may be various commercially available commonly-used dispersants in the art. Specifically, the dispersant may be at least one selected from a group consisting of: the dispersants commercially available from BYK Company, Germany under trademarks of ANTI-TERRA-U, ANTI-TERRA-U 80, ANTI-TERRA-U 100, DISPERBYK-101, DISPERBYK-130, BYK-220 S, LACTIMON, LACTIMON-WS, BYK-W 966, DISPERBYK, BYK-154, BYK-9076, DISPERBYK-108, DISPERBYK-109, DISPERBYK-110, DISPERBYK-102, DISPERBYK-111, DISPERBYK-180, DISPERBYK-106, DISPERBYK-187, DISPERBYK-181, DISPERBYK-140, DISPERBYK-142, DISPERBYK-145, DISPERBYK-115, DISPERBYK-160, DISPERBYK-161, DISPERBYK-162, DISPERBYK-163, DISPERBYK-164, DISPERBYK-165, DISPERBYK-166, DISPERBYK-167, DISPERBYK-182, DISPERBYK-183, DISPERBYK-184, DISPERBYK-185, DISPERBYK-168, DISPERBYK-169, DISPERBYK-170, DISPERBYK-171, DISPERBYK-174, DISPERBYK-190, DISPERBYK-2150, BYK-9077, DISPERBYK-112, DISPERBYK-116, DISPERBYK-191, DISPERBYK-192, DISPERBYK-2000, DISPERBYK-2001, DISPERBYK-2010, DISPERBYK-2020, DISPERBYK-2025, DISPERBYK-2050 and DISPERBYK-2070; the dispersant commercially available from Holland Akzo Nobel Company under a trademark of PHOSPHLAN PS-26; the dispersant commercially available from Witco Chemical Company, USA under a trademark of PS-21A; the dispersants of the Hypermer KD series and Zephrym PD series which are commercially available from Croda Company, UK.

In one embodiment of the present disclosure, the usage amount of the dispersant may be a conventional usage amount in the art. Generally, based on 100 weight parts of the metal compound, the amount of the dispersant may be about 0.1 to 4 weight parts.

In one embodiment of the present disclosure, the defoamers may be various commonly-used substances in the art which can suppress the forming of foam, destroy formed foam or disengage the formed foam from the system. For example, the defoamers may be organic silicone defoamer, polyether defoamer and higher alcohol defoamer. Preferably, the defoamer is organic silicone defoamer.

In one embodiment of the present disclosure, the defoamers may be various commonly-used defoamers in the art which are commercially available. Specifically, the defoamer may be at least one selected from a group consisting of the defermers commercially available from BYK Company, Germany under trademarks of BYK-051, BYK-052, BYK-053, BYK-055, BYK-057, BYK-020, BYK-065, BYK-066N, BYK-067A, BYK-070, BYK-080A, BYK-088, BYK-141, BYK-019, BYK-021, BYK-022, BYK-023, BYK-024, BYK-025, BYK-028, BYK-011, BYK-031, BYK-032, BYK-033, BYK-034, BYK-035, BYK-036, BYK-037, BYK-038, BYK-045, BYK-A530, BYK-A555, BYK-071, BYK-060, BYK-018, BYK-044 and BYK-094.

In one embodiment of the present disclosure, the usage amount of the defoamer may be a conventional usage amount in the art. Preferably, based on 100 weight parts of the metal compound, the amount of the defoamer may be about 0.1 to 3 weight parts.

In one embodiment of the present disclosure, the flatting agent is used to promote the ink composition forming more flat, smooth and uniform film layer during drying and film-forming process. The present disclosure has no special restriction to the type of the flatting agent; it may be a commonly-used substance in the art which can achieve the above function. For example, the flatting agent may be at least one selected from a group consisting of polyacrylate flatting agent, polydimethylsiloxane flatting agent, polymethylphenylsiloxane flatting agent and fluorine-containing surfactant.

In one embodiment of the present disclosure, the flatting agents may be various commonly-used flatting agents in the art which are commercially available. For example, the flatting agent may be at least one selected from a group consisting of the flatting agents commercially available from BYK Company, Germany under trademarks of BYK-333, BYK-306, BYK-358N, BYK-310, BYK-354 and BYK-356.

In one embodiment of the present disclosure, the usage amount of the flatting agent may be a conventional usage amount, there is no special restriction. Preferably, based on 100 weight parts of the metal compound, the amount of the flatting agent is about 0.3 to 4 weight parts.

In one embodiment of the present disclosure, the viscosity modifier is used to adjust the viscosity of the ink composition. The present disclosure has no special restriction to the type of the viscosity modifier; it may be a conventional selection in the art. For example, the viscosity modifier may be at least one selected from a group consisting of gas silica, polyamide waxes, organic bentonite, hydrogenated castor oil, metallic soaps, hydroxyalkyl cellulose and derivatives thereof, polyvinyl alcohol and polyacrylates.

In one embodiment of the present disclosure, the usage amount of the viscosity modifier may be conventionally selected in the art. Preferably, based on 100 weight parts of the metal compound, the amount of the viscosity modifier is about 0.3 to 3 weight parts.

In one embodiment of the present disclosure, the ink composition comprises the metal compound, the ink vehicle, the solvent, the deformer, the flatting agent and the viscosity modifier, which are defined above. Based on 100 weight parts of the metal compound, the amount of the ink vehicle is about 1 to 30 weight parts, the amount of the solvent is about 20 to 200 weight parts, the amount of the dispersant is about 0.4 to 4 weight parts, the amount of the defoamer is about 0.1 to 3 weight parts, the amount of the flatting agent is about 0.3 to 4 weight parts, and the amount of the viscosity modifier is about 0.3 to 3 weight parts.

The preparation method for the ink composition according to the present disclosure is not specially limited, as long as it may evenly mix the metal compound and the ink vehicle as well as optional solvent and auxiliary agent. For example, it may evenly mix the metal compound and the ink vehicle as well as optional solvent and auxiliary agent in a mixer (such as Star ball mill) to obtain the ink composition according to the present disclosure. The method and condition of evenly mixing in the mixer are known in the art, there is no need to repeat.

In one embodiment of the present disclosure, it may adopt various commonly-used methods in the art to apply the ink composition onto the surface of the insulation substrate. For example, the ink composition may be applied onto the surface to be metalized of the insulation substrate by using at least one method selected from the group consisting of screen printing, spraying, laser printing, ink-jet printing, transfer printing, gravure, letterpress printing and lithograph. The method according to the present disclosure is particular suitable for applying the ink composition onto the surface to be metalized of the insulation substrate by a means of an ink-jet printing or a laser printing. The specific operation method and condition of the above screen printing, spraying, laser printing, ink-jet printing, transfer printing, gravure, letterpress printing and lithograph are well-known in the art which do not need to repeat.

In one embodiment of the present disclosure, the method may also comprise: applying the ink composition onto the surface of the insulation substrate, subjecting the substrate having the ink composition to drying. The method for drying of the present disclosure has no special restriction, it may be appropriately selected according to the ink vehicle in the ink composition and the type of the optional solvent. For examples, the temperature of the drying may be about 80 to 150 degrees Celsius, and the time may be about 0.5 to 5 hours.

In one embodiment of the present disclosure, the thickness of the ink layer may be appropriately selected according to the constituent of the ink composition, as long as electronic plating or chemical plating may be performed on the surface of the insulation substrate, and then the metalizing of the insulation substrate surface is obtained. Preferably, the ink layer may have a thickness of about 8 to 50 microns. More preferably, the ink layer may have a thickness of about 12 to 40 microns. More preferably, the ink layer may have a thickness of about 12 to 25 microns.

In one embodiment of the present disclosure, the method also further comprises subjecting the insulation substrate with the ink layer to heat treatment at a temperature of about 500 to 1000 degrees Celsius in a non-reactive atmosphere, prior to the step of plating. This may improve the adhesion force (eg. bonding force) of the metal layer formed by the method of present disclosure to the substrate. To further improve the adhesion force of the metal layer to the substrate, the temperature of heat treatment is about 700 to 900 degrees Celsius. The present disclosure has no special restriction to the time of the heat treatment, as long as it may ensure to improve the adhesion force of the metal layer finally formed to the substrate. Preferably, the time of the heat treatment is about 1 to 5 hours. In one embodiment of the present disclosure, the heat treatment is performed in the non-reactive atmosphere, and the non-reactive atmosphere refers to an atmosphere forming by chemical inert gas, such as a nitrogen atmosphere, an atmosphere forming by Group Zero gas (such as Ar).

In one embodiment of the present disclosure, to further improve the adhesion force of the finally formed metal layer to the substrate, the means of applying the ink composition onto the surface to be metalized of the insulation substrate comprises: mixing the ink composition and with an inorganic binder to form a mixture; and applying the mixture to the surface to be metalized, based on 100 weight parts of the ink composition, where, the amount of the inorganic binder is about 1 to 15 weight parts. Preferably, based on 100 weight parts of the ink composition, and the amount of the inorganic binder is about 5 to 10 weight parts.

The method according to the present disclosure has no special restriction to the type of the inorganic binder; it may be various commonly-used inorganic binders in the art. Preferably, the inorganic binder is at least one selected from a group consisting of $SiO_2$, $CaO$, $Na_2O$, $ZnO$ and $Ni_2O_3$.

In one embodiment of the present disclosure, the method further comprises: plating at least one metal layer onto the insulation substrate with the ink layer by using electronic plating or chemical plating. The method according to the present disclosure may perform chemical plating or electronic plating directly on the surface of the insulation substrate, the surface having no ink layer of the insulation substrate will not be metalized during the process of chemical plating or electronic plating. The method according to the present disclosure not only has high production efficiency, but also may form fine metalized pattern.

In one embodiment of the present disclosure, the method of chemical plating or electronic plating on the ink layer of the substrate surface has no special restriction, and it may be conventionally selected in the art which do not need to repeat.

In one embodiment of the present disclosure, in accordance with the specific operating requirement, the chemical plating or electronic plating may be performed on the substrate surface having the ink layer at lease once, so as to form at least one layer of the metal layer on the substrate surface. In one embodiment of the present disclosure, when chemical plating or electronic plating at least one on the substrate to form multi-layer of the metal layer on the substrate surface, the constituent and the thickness of each metal layer may be appropriately selected according to the specific operation requirement, and the metal in each metal layer may be same or different.

Preferably, the metal layer may comprise at least two layers. In one embodiment, a Cu layer is formed on the substrate surface, and a Ni layer is formed on the outer surface of the Cu layer. In one embodiment, a Cu layer is formed on the substrate surface, and a Ni layer is formed on the outer surface of the Cu layer. In one embodiment, a first Ni layer is formed on the substrate surface, a Cu layer is formed on the outer surface of the first Ni layer, and a second Ni layer is formed on the outer surface of the Cu layer. In one embodiment, a first Ni layer is formed on the substrate surface, a Cu layer is formed on the outer surface of the first Ni layer, a second Ni layer is formed on the outer surface of the Cu layer, and an Au layer is formed on the outer surface of the second Ni layer. In one embodiment, a Cu layer is formed on the substrate surface, a Ni layer is formed on the outer surface of the Cu layer, and an Ag layer is formed on the outer surface of the Ni layer. The method according to the present disclosure has no special restriction to the thickness of each metal layer, as long as it may be able to meet the requirements. Generally, the thickness of the Ni layer may be about 3 to 4 microns, the thickness of the Cu layer may be about 10 to 60 microns, and the thickness of the Au layer may be about 0.02 to 0.08 microns.

In one embodiment of the present disclosure, the insulation substrate may be ceramic substrate, glass substrate or cement substrate. Preferably, the insulation substrate is ceramic substrate.

The present disclosure also provides an article having a metalizing surface prepared according to the method of the present disclosure. It should be noted that the features and advantages described above for the ink composition or method will also apply to the article. The article of the present disclosure has a high adhesion force of the metal layer surface to the substrate, and the article of the present disclosure has a very high signal sensitivity when used as a signal transduction component.

The invention will be further described below in way of exmaple. Raw materials used in Examples and Comparative Examples are all commercially available.

In the following examples, the composition of the metal compound is measured by a photoelectron spectroscopy method (XPS).

In the following examples, the average particle size of the metal compound is measured using laser particle size tester commercially available from Chengdu fine new Powder Testing Equipment Co. Ltd. The average particle size is a volume average particle size.

In the following examples, the thickness of the ink layer is measured using a scanning electron microscopy (SEM).

In the following examples, the adhesion force of the metal layer formed on the substrate surface is measured by means of Cross-Cut Tape Test. Specifically, the Cross-Cut Tape Tes comprises: cutting a lattice pattern of 10×10 squares with 1 mm×1 mm of each square using a Cross-cutter on the surface of test sample, in which each cut shall penetrate to the bottom layer of the metal layer, cleaning the test sample using a brush to remove debris from the area; adhering a tape (3M No. 600 tape) over the lattice pattern; removing the tape by grasping a free end and pulling it off quicking in a vertical direction. Repeat the same test twice at a same site, and the adhesion force grade is determined according to the following stardards:

5B: The edges of the cuts are smooth, and none of the squares of the lattices is detached;
4B: Detachment of small flakes at the intersections of the lattices, and the detached area is less than 5%;
3B: Detachment of small flakes at the intersections and edges of the lattices, and the detached area is between 5-15%;
3B: Detachment of large flakes at the intersections and edges of the lattices, and the detached area is between 5-15%;
2B: Detachment of large flakes at the intersections and edges of the lattices, and the detached area is between 15-35%;
1B: Detachment of large flakes at the intersections and edges of the lattices, and the detached area is between 35-65%; and
0B: Detachment of large flakes at the intersections and edges of the lattices, and the detached area is greater than 65%.

In the following examples, Total Isotropic Sensitivity (TIS) is measured using the method specified in YD/T 1484-2006, in which GSM1800 system is applied, and the surface of the substrate is metalized to form a pattern as an antenna of a receiver. The measurement is performed under a mode of antenna unplugged in a free space, and the frequency of measurement is 2112 MHz. Results of measurement are reported in a term of dBm, and the larger its absolute value, the higher the sensitivity of signal.

Examples 1-31 are used for illustrating the method of metalized a substrate surface.

EXAMPLE 1

(1) 80 g CuO powder and 80 g $Fe_2O_3$ powder were mixed evenly to form a mixture, the mixture was then subjected to grinding for 12 hours in a ball mill under a media of ethanol, after the ball-mill product was dried, the dried mixture was subjected to calcination for 5 hours at a temperature of 750 Celsius degrees under a mixture atmosphere of hydrogen and nitrogen (the volume ratio between hydrogen and nitrogen was 2:1) to form a calcinated product, the calcinated product was then grinded to an average particle size of about 80 nm. The prepared product was $CuFeO_{3.98}$.

(2) 100 g product prepared in step (1), 15 g polyvinyl butyral (commercially available from Kuraray Company, Japan under a trademark of Mowital) and 20 g toluene were evenly mixed to obtain an ink composition of the present example.

(3) The ink composition prepared in step (2) was applied onto a surface of a $Al_2O_3$ ceramic substrate by an ink-jet printing method, the ink compositon was dried for 3 hours at a temperature of about 120 Celsius degrees, and then was subjected to heat treatment at a temperature of about 800 degrees Celsius for 2 hours under a nitrogen atmosphere, thereby an ink layer was formed on the substrate surface with a thickness of about 12 μm.

(4) The surface having the ink layer on the substrate was subjected to electronic plating to form a copper plating, and current intensity was $3A/cm^2$.

COMPARATIVE EXAMPLE 1

The substrate surface was metalized by a method which is substantially the same as the method in Example 1, with the following exception, a process of subjecting to heat treatment at a temperature of about 800 degrees Celsius for 5 hours under a nitrogen atmosphere was omitted.

EXAMPLE 2

The substrate surface was metalized by a method which is substantially the same as the method in Example 1, with the following exceptions, In step (1), 80 g CuO powder and 80 g $Fe_2O_3$ powder were mixed evenly to form a mixture, the mixture was then subjected to grinding for 12 hours in a ball mill under a media of ethanol. After the ball-mill product was dried, the dried mixture was subjected to calcination for 12 hours at a temperature of 1000 Celsius degrees under a mixture atmosphere of hydrogen and nitrogen (the volume ratio between hydrogen and nitrogen was 2:1) to form a calcinated product, the calcinated product was then grinded to an average particle size of about 80 nm. The prepared product was $CuFeO_{3.2}$;

In step (3), the ink composition prepared in step (2) was evenly mixed with $Ni_2O_3$ (based on 100 g of the ink composition, the usage amount of $Ni_2O_3$ was 10 g) to form a mixture, the mixture obtained was applied onto a surface of a $ZrO_2$ ceramic substrate by an ink-jet printing method, and the mixture was dried for 3 hours at a temperature of about 120 Celsius degrees, and then the dried mixture was subjected to heat treatment at a temperature of about 900 Celsius degrees in a nitrogen atmosphere for 1 hour, and thereby an ink layer was formed on the substrate layer with a thickness of about 15 μm.

In step (4), the substrate with the surface having the ink layer was placed in a plating solution to perform chemical plating. The compositions of the plating solution were: 0.12 mol/L $CuSO_4.5H_2O$, 0.14 mol/L $Na_2EDTA.2H_2O$, 10 mg/L potassium ferrocyanide, 10 mg/L 2,2'-bipyridine, 0.10 mol/L glyoxylic acid. The plating solution was adjusted to a pH of 12.5-13 by using solutions of NaOH and $H_2SO_4$, and the temperature of the plating solution was 50 Celsius degrees.

EXAMPLE 3

The substrate surface was metalized by a method which is substantially the same as the method in Example 2, with the following exception: $Ni_2O_3$ is not used.

EXAMPLE 4

The substrate surface was metalized by a method which is substantially the same as the method in Example 1, with the following exceptions: $CaCu_3Ti_4O_{12}$ (according to Fu Qiang et al., Preparation method published in (Preparation method of $CaCu_3Ti_4O_{12}$ ceramics and property thereof, Wuhan University Academic Journey (Natural Science Version) 54(4): 381-384, 2008, being similar thereafter) was subjected to calcination at a temperature of about 800 Celsius degrees for 5 hours in a mixture atmosphere of hydrogen and nitrogen (the volume ratio between hydrogen and nitrogen was 2:1) to form a calcined product, then the calcined product was grinded in a ball-mill to an average particle size of about 80 nm. The prepared product was $Ca_{0.1}Cu_{0.9}TiO_{2.95}$.

COMPARATIVE EXAMPLE 2

The substrate surface was metalized by a method which is substantially the same as the method in Example 5, with the following exception: a process of subjecting to heat treatment at a temperature of about 800 degrees Celsius for 2 hours under a nitrogen atmosphere was omitted.

EXAMPLE 5

The substrate surface was metalized by a method which is substantially the same as the method in Example 4, with the following exceptions: the ink composition prepared in step (2) was evenly mixed with $SiO_2$ (comparing to 100 g ink composition, the usage amount of $SiO_2$ was 10 g) to form a mixture, the mixture was then applied onto a surface of a $Al_2O_3$ ceramic substrate by an ink-jet printing method, and thereby an ink layer was formed on the substrate surface.

EXAMPLE 6

The substrate surface was metalized by a method which is substantially the same as the method in Example 1, with the following exceptions: a metal compound was prepared by following method: 4 g MgO powder and 18.7 g $Ga_2O_3$ powder were evenly mixed to form a mixture, then the mixture was placed in a ball-mill and subjected to grinding for 12 hours with water as media to obtain a grinded product. After being dried, the grinded product was subjected calcination at a temperature of about 1000 degrees Celsius for about 12 hours in a mixture atmosphere of hydrogen and nitrogen (the volume ratio between hydrogen and nitrogen was 2:1) to form a calcinated product. Then the calcinated product was subjected to grinding to an average particle size of about 80 nm. The final prepared product was $MgGa_2O_{3.8}$.

EXAMPLE 7

The substrate surface was metalized by a method which is substantially the same as the method in Example 1, with the following exceptions: a metal compound was prepared by following method: 54.1 g CuO (commercially available from Aladdin Reagent Company with an average particle size of about 40 nm), 27.1 g $Fe_2O_3$ (commercially available from Aladdin Reagent Company with an average particle size of about 100 nm) and 26.9 g $Mn_2O_3$ (commercially available from Aladdin Reagent Company with an average particle size of about 200 nm) were evenly mixed to form a mixture, then the mixture was placed in a ball-mill and subjected to calcinated at a temperature of about 1000 degrees Celsius for 10 hours to obtain a calcinated product. The obtained calcinated product was subjected to grinding to an average particle size of about 80 nm. The final prepared product was $CuFe_{0.5}Mn_{0.5}O_{2.5}$.

COMPARATIVE EXAMPLE 3

The substrate surface was metalized by a method which is substantially the same as the method in Example 7 with the following exception, and a process of subjecting to heat treatment at a temperature of about 800 degrees Celsius for 2 hours under a nitrogen atmosphere was omitted.

EXAMPLE 8

The substrate surface was metalized by a method which is substantially the same as the method in Example 1, with the following exceptions: a metal compound was prepared by following method: 54.1 g CuO (commercially available from Aladdin Reagent Company with an average particle size of about 40 nm), 27.1 g $Fe_2O_3$ (commercially available from Aladdin Reagent Company with an average particle size of about 100 nm) and 17.3 g $Al_2O_3$ (commercially available from Aladdin Reagent Company with an average particle size of about 100 nm) were evenly mixed to form a mixture, then the mixture was subjected to calcination at a temperature of 1000 degrees Celsius for 10 hours in a $N_2$ atmosphere to obtain a calcinated product. Then the calcinated product was subjected to grinding to powder having an average particle size of about 80 nm in a ball-mill. The final product prepared was $CuFe_{0.5}Al_{0.5}O_{2.5}$.

EXAMPLE 9

The substrate surface was metalized by a method which is substantially the same as the method in Example 1, with the following exceptions: a metal compound was prepared by following method: 54.1 g CuO (commercially available from Aladdin Reagent Company with an average particle size of about 40 nm), 13.6 g $Fe_2O_3$ (commercially available from Aladdin Reagent Company with an average particle size of about 100 nm), 8.7 g $Al_2O_3$ (commercially available from Aladdin Reagent Company with an average particle size of about 100 nm) and 26.9 g $Mn_2O_3$ (commercially available from Aladdin Reagent Company with an average particle size of about 200 nm) were evenly mixed to form a mixture, then the mixture was subjected to calcination at a temperature of 1000 degrees Celsius for 20 hours in a $NH_3$ atmosphere to obtain a calcinated product. Then the calcinated product was subjected to grinding to powder having an average particle size of about 80 nm in a ball-mill. The final product prepared was $CuFe_{0.25}Al_{0.25}Mn_{0.5}O_{2.5}$.

EXAMPLE 10

The substrate surface was metalized by a method which is substantially the same as the method in Example 9, with the following exceptions: the ink composition prepared in step (2) was evenly mixed with $SiO_2$ (comparing to 100 g ink composition, the usage amount of $SiO_2$ was 5 g) to form a mixture, the obtained mixture was applied onto a surface of a $Al_2O_3$ ceramic substrate by an ink-jet printing method.

EXAMPLE 11

The substrate surface was metalized by a method which is substantially the same as the method in Example 1, with the following exceptions: a metal compound was prepared by following method: 58 g CuO, 34 g $Ga_2O_3$ and 14 g $B_2O_3$ were evenly mixed to form a mixture, then the mixture was placed in a ball-mill and subjected to grinding for 12 hours with water as media to obtain a grinded product. After being dried, the grinded product was subjected calcination at a temperature of about 1000 degrees Celsius for about 12 hours under a mixture atmosphere of hydrogen and nitrogen (the volume ratio between hydrogen and nitrogen was 2:1) to obtain a calcinated product. The calcinated product was then grinded to an average particle size of about 80 nm. The prepared product was $CuGa_{0.5}B_{0.5}O_{2.5}$.

COMPARATIVE EXAMPLE 4

The substrate surface was metalized by a method which is substantially the same as the method in Example 11 with the following exception, a process of subjecting to heat treatment at a temperature of about 800 degrees Celsius for 2 hours under a nitrogen atmosphere was omitted.

EXAMPLE 12

The substrate surface was metalized by a method which is substantially the same as the method in Example 1, with the following exceptions: a metal compound was prepared by following method: 80 g CuO, 40 g $Fe_2O_3$ and 17 g $B_2O_3$ were evenly mixed to form a mixture, then the mixture was placed in a ball-mill and subjected to grinding for 12 hours with water as media to obtain a grinded product. After being dried, the grinded product was subjected calcination at a temperature of about 1000 degrees Celsius for about 12 hours under a mixture atmosphere of hydrogen and nitrogen (the volume ratio between hydrogen and nitrogen was 2:1) to obtain a calcinated product. The calcinated product was then grinded to an average particle size of about 80 nm. The prepared product was $CuFe_{0.5}B_{0.5}O_{2.5}$.

COMPARATIVE EXAMPLE 5

The substrate surface was metalized by a method which is substantially the same as the method in Example 12 with the following exception, and a process of subjecting to heat treatment at a temperature of about 800 degrees Celsius for 2 hours under a nitrogen atmosphere was omitted.

EXAMPLE 13

The substrate surface was metalized by a method which is substantially the same as the method in Example 1, with the following exceptions: a metal compound was prepared by following method: 45 g $Ni_2O_3$, 80 g CuO and 18 g $B_2O_3$ were evenly mixed to form a mixture, and then the mixture was placed in a ball-mill and subjected to grinding for 12 hours with water as media to obtain a grinded product. After being dried, the grinded product was subjected to calcination at a temperature of about 1000 degrees Celsius for about 12 hours under a mixture atmosphere of hydrogen and nitrogen (the volume ratio between hydrogen and nitrogen was 2:1) to obtain a calcinated product. The calcinated product was then grinded to an average particle size of about 80 nm. The prepared product was $CuNi_{0.5}B_{0.5}O_{2.5}$.

EXAMPLE 14

The substrate surface was metalized by a method which is substantially the same as the method in Example 1, with the following exceptions: a metal compound was prepared by following method: 80 g CuO and 25 g $B_2O_3$ were evenly mixed to form a mixture, and then the mixture was placed in a ball-mill and subjected to grinding for 12 hours with water as media to obtain a grinded product. After being dried, the grinded product was subjected to calcination at a temperature of about 900 degrees Celsius for about 6 hours under an air atmosphere. The calcinated product was then grinded to an average particle size of about 80 nm. The prepared product was $CuB_{0.7}O_2$.

EXAMPLE 15

The substrate surface was metalized by a method which is substantially the same as the method in Example 1, with the following exceptions: a metal compound was prepared by following method: 75 g $Ni_2O_3$ and 128 g $MoO_3$ were evenly mixed to form a mixture, then the mixture was placed in a ball-mill and subjected to grinding for 12 hours with water as media to obtain a grinded product. After being dried, the grinded product was subjected to calcination at a temperature of about 900 degrees Celsius for about 6 hours under a $N_2$ atmosphere. The calcinated product was then grinded to an average particle size of about 80 nm. The prepared product was $NiMoO_{3.8}$.

COMPARATIVE EXAMPLE 6

The substrate surface was metalized by a method which is substantially the same as the method in Example 15 with the following exception, and a process of subjecting to heat treatment at a temperature of about 800 degrees Celsius for 2 hours under a nitrogen atmosphere was omitted.

EXAMPLE 16

The substrate surface was metalized by a method which is substantially the same as the method in Example 1, with the following exceptions: the ink composition was evenly mixed with $Ni_2O_3$ (comparing to 100 g ink composition, the usage amount of $Ni_2O_3$ is 15 g) to form a mixture, and the obtained mixture was applied onto a surface of a $Al_2O_3$ ceramic substrate by an ink-jet printing method.

EXAMPLE 17

The substrate surface was metalized by a method which is substantially the same as the method in Example 1, with the following exceptions: a metal compound was prepared by following method: nano-titanium dioxide (commercially available from Aladdin Reagent Company having an average particle size of about 60 nm) was loaded in the middle of a porcelain boat, the boat was placed into a reaction tube which was then placed at a high temperature section of a muffle furnace. Both ends of the reaction tube were tightly sealed with a rubber plug and were cooled with dripping water, and an atmosphere of ammonia gas was charged into the tube to replace the air within the tube. At the same time, a pH test paper was used to check the sealing condition of the reaction apparatus, and in the case of no ammonia leakage the power was turned on, the ammonia flow rate was controlled at 2.4 $cm^3/s$. The temperature of the muffle furnace was raised to 800 Celsius degrees which was maintained for 5 hours, and then the boat was cooled down to 80 Celsius degrees under the ammonia gas atmosphere. After turning off the ammonia gas, the boat was taken out and placed in a desiccator to cool down to room temperature, then a compound of formula I was obtained. The prepared titanium oxide was grinded to an average particle size of about 80 nm by high-speed ball mill the obtained titanium oxide is $TiO_{0.9}$.

COMPARITVE EXAMPLE 7

The substrate surface was metalized by a method which is substantially the same as the method in Example 17 with the following exception, and a process of subjecting to heat treatment at a temperature of about 800 degrees Celsius for 2 hours under a nitrogen atmosphere was omitted.

EXAMPLE 18

The substrate surface was metalized by a method which is substantially the same as the method in Example 1, with the following exceptions: the ink composition was evenly mixed with $Ni_2O_3$ (comparing to 100 g ink composition, the usage amount of $Ni_2O_3$ is 10 g) to form a mixture, and the obtained mixture was applied onto a surface of a $Al_2O_3$ ceramic substrate by an ink-jet printing method.

EXAMPLE 19

(1) The substrate surface was metalized by a method which is substantially the same as the method in Example 1, with the following exceptions: a metal compound was prepared by following method: nano-titanium dioxide (commercially available from Aladdin Reagent Company having an average particle size of about 60 nm) was loaded in the middle of a porcelain boat, the boat was placed into a reaction tube which was then placed at a high temperature section of a muffle furnace. Both ends of the reaction tube were tightly sealed with a rubber plug and were cooled with dripping water, and an atmosphere of ammonia gas was charged into the tube to replace the air within the tube. At the same time, a pH test paper was used to check the sealing condition of the reaction apparatus, and in the case of no ammonia leakage the power was turned on, the ammonia flow rate was controlled at 4 $cm^3/s$. The temperature of the muffle furnace was raised to 780 Celsius degrees which was maintained for 4 hours, and then the boat was cooled down to 100 Celsius degrees under the ammonia gas atmosphere. After turning off the ammonia gas, the boat was taken out and placed in a desiccator to cool down to room temperature; the prepared titanium oxide was grinded to an average particle size of about 40 nm by high-speed ball mill. The obtained titanium oxide is $TiO_{1.67}$.

(2) 50 g titanium oxide prepared according to step (1), 1 g ink vehicle (commercially available from Eastman Chemical Company under a trademark of CAB381-2), 20 g n-heptanol, 0.2 g dispersant (commercially available from Witco Company, USA under a trademark of PS-21A), 0.2 g defoamer (commercially available from BYK Company, Germany under a trademark of BYK-051), 0.3 g flatting agent (commercially available from BYK Company, Germany under a trademark of BYK-333) and 0.3 g polyamide wax (commercially available from Klein Company, Germany under a trademark of FA1) were evenly mixed to obtain the ink composition of the present example.

(3) The ink composition obtained in step (2) was evenly mixed with 10 g $Na_2O$ to form a mixture, then the obtained mixture was applied onto a surface of a cement substrate by a lithograph method, after dried for 5 hours at a temperature of 90 Celsius degrees, the ink composition was then subjected to heat treatment at a temperature of about 1000 degrees Celsius for 2 hours to form an ink layer on the substrate surface, and the ink layer had a thickness of about 15 μm.

(4) A metal layer was formed on the substrate surface obtained in step (3) by a method which is substantially the same as the method in Example 1.

EXAMPLE 20

The substrate surface was metalized by a method which is substantially the same as the method in Example 1, with the following exception: the metal compound is nano-copper oxide (commercially available from Aladdin Reagent Company with an average particle size of about 80 nm).

COMPARATIVE EXAMPLE 8

The substrate surface was metalized by a method which is substantially the same as the method in Example 20 with the following exception, and a process of subjecting to heat treatment at a temperature of about 800 degrees Celsius for 2 hours under a nitrogen atmosphere was omitted.

EXAMPLE 21

The substrate surface was metalized by a method which is substantially the same as the method in Example 1, with the following exception: the metal compound is nano-cuprous oxide (commercially available from Aladdin Reagent Company with an average particle size of about 80 nm).

COMPARATIVE EXAMPLE 9

The substrate surface was metalized by a method which is substantially the same as the method in Example 21 with the following exception, and a process of subjecting to heat treatment at a temperature of about 800 degrees Celsius for 2 hours under a nitrogen atmosphere was omitted.

EXAMPLE 22

(1) 100 g nano-copper oxide (commercially available from Aladdin Reagent Company having an average particle size of about 100 nm), 12 g ink vehicle (commercially available from Eastman Chemical Company under a trademark of CAB381-20), 100 g ethanol, 0.6 g dispersant (commercially available from BYK Company, Germany under a trademark of BYK-220 S), 0.4 g defoamer (commercially available from BYK Company, Germany under a trademark of BYK-065), 0.5 g flatting agent (commercially available from BYK Company, Germany under a trademark of BYK-306) and 0.3 g sodium polyacrylate (commercially available from Aladdin Reagent Company) were evenly mixed to obtain the ink composition of the present example.

(2) The ink composition obtained in step (1) was applied onto a surface of a $ZrO_2$ substrate by an ink-jet printing method, after dried for 5 hours at a temperature of 170 Celsius degrees, the ink composition was then subjected to heat treatment at a temperature of about 700 degrees Celsius for 5 hours in a $N_2$ atmosphere to form an ink layer on the substrate surface, and the ink layer had a thickness of about 20 μm.

(3) A metal layer was formed on the substrate surface obtained in step (3) by a method which is substantially the same as the method in Example 1.

EXAMPLE 23

The substrate surface was metalized by a method which is substantially the same as the method in Example 22, with the following exception: the ink composition was then subjected to heat treatment at a temperature of about 500 degrees Celsius for 5 hours.

EXAMPLE 24

The substrate surface was metalized by a method which is substantially the same as the method in Example 22, with the following exceptions: the metal compound is nano-cuprous oxide (commercially available from Aladdin Reagent Company with an average particle size of about 40 nm); the ink composition was evenly mixed with 10 g $Na_2O$ to form a mixture, then the obtained mixture was applied onto a surface of a glass substrate by a laser printing method, after the surface with the ink layer of the substrate was subjected to drying, and the ink composition was then subjected to heat treatment at a temperature of about 900 degrees Celsius for 1 hour in a $N_2$ atmosphere.

EXAMPLE 25

The substrate surface was metalized by a method which is substantially the same as the method in Example 24, with the following exception: the ink composition was then subjected to heat treatment at a temperature of about 1000 degrees Celsius for 1 hour in a $N_2$ atmosphere.

COMPARATIVE EXAMPLE 10

The substrate surface was metalized by a method which is substantially the same as the method in Example 24 with the following exception: the ink composition was then subjected to heat treatment at a temperature of about 1200 degrees Celsius for 1 hour in a $N_2$ atmosphere.

COMPARATIVE EXAMPLE 11

The substrate surface was metalized by a method which is substantially the same as the method in Example 23 with the following exception: the ink composition was then subjected to heat treatment at a temperature of about 400 degrees Celsius for 5 hours in a $N_2$ atmosphere.

EXAMPLE 26

The substrate surface was metalized by a method which is substantially the same as the method in Example 22 with the following exception: the nano-copper oxide has an average particle size of about 150 nm.

EXAMPLE 27

The substrate surface was metalized by a method which is substantially the same as the method in Example 22 with the following exception: the nano-copper oxide has an average particle size of about 500 nm.

COMPARATIVE EXAMPLE 12

The substrate surface was metalized by a method which is substantially the same as the method in Example 1 with the following exception: the metal compound was replaced by silver powders having an average particle of about 80 nm.

EXAMPLE 28

The substrate surface was metalized by a method which is substantially the same as the method in Example 2, with the following exceptions: a metal compound was prepared by following method: $CaCu_3Ti_4O_{12}$ was subjected calcination at a temperature of about 1000 Celsius degrees for 2 hours in a mixture atmosphere of hydrogen and nitrogen (the volume ratio between hydrogen and nitrogen was 2:1) to form a calcined product, then the calcined product was grinded in a ball-mill to an average of about 100 nm. The prepared product was $Ca_{0.25}Cu_{0.75}TiO_{2.65}$.

EXAMPLE 29

The substrate surface was metalized by a method which is substantially the same as the method in Example 2, with the following exceptions: a metal compound was prepared by following method: 75 g $Ni_2O_3$ and 128 g $MoO_3$ were evenly mixed to form a first mixture, then the mixture was placed in a ball-mill and subjected to grinding for 12 hours with water as media to obtain a grinded product. After being dried, the grinded product was subjected to calcination at a temperature of about 900 degrees Celsius for about 8 hours under an $N_2$ atmosphere. The calcinated product was then grinded to an average particle size of about 100 nm. The prepared product was $NiMoO_{3.5}$.

EXAMPLE 30

The substrate surface was metalized by a method which is substantially the same as the method in Example 2 with the following exception: the metal compound was nano-cuprous oxide (commercially available from Aladdin Reagent Company with an average particle size of about 40 nm).

EXAMPLE 31

The substrate surface was metalized by a method which is substantially the same as the method in Example 2 with the following exception: the metal compound was nano-cuprous oxide (commercially available from Aladdin Reagent Company with an average particle size of about 60 nm).

The plating rate, thickness of the formed metal layer, adhesion force and signal receiving sensitivity in Example 1-31 and Comparative Example 1-12 were shown in Table 1

TABLE 1

| No. | Metal compound | substrate | Plating rate/μm·h$^{-1}$ | Thickness of metal layer/μm | Adhesion force | TIS |
|---|---|---|---|---|---|---|
| Example 1 | CuFeO$_{3.98}$ | Al$_2$O$_3$ | 100 | 30 | 4B | −100 |
| Comparative Example 1 | CuFeO$_{3.98}$ | Al$_2$O$_3$ | 95 | 30 | 3B | −100 |
| Example 2 | CuFeO$_{3.2}$ | ZrO$_2$ | 3.1 | 20 | 5B | −100 |
| Example 3 | CuFeO$_{3.2}$ | ZrO$_2$ | 2.9 | 20 | 4B | −100 |
| Example 4 | Ca$_{0.1}$Cu$_{0.9}$TiO$_{2.95}$ | Al$_2$O$_3$ | 94 | 30 | 4B | −103 |
| Comparative Example 2 | Ca$_{0.1}$Cu$_{0.9}$TiO$_{2.95}$ | Al$_2$O$_3$ | 88 | 30 | 3B | −103 |
| Example 5 | Ca$_{0.1}$Cu$_{0.9}$TiO$_{2.95}$ | Al$_2$O$_3$ | 95 | 30 | 5B | −103 |
| Example 6 | MgGa$_2$O$_{3.8}$ | Al$_2$O$_3$ | 68 | 30 | 4B | −103 |
| Example 7 | CuFe$_{0.5}$Mn$_{0.5}$O$_{2.5}$ | Al$_2$O$_3$ | 91 | 30 | 4B | −101 |
| Comparative Example 3 | CuFe$_{0.5}$Mn$_{0.5}$O$_{2.5}$ | Al$_2$O$_3$ | 82 | 30 | 3B | −101 |
| Example 8 | CuFe$_{0.5}$Al$_{0.5}$O$_{2.5}$ | Al$_2$O$_3$ | 85 | 20 | 4B | −101 |
| Example 9 | CuFe$_{0.25}$Al$_{0.25}$Mn$_{0.5}$O$_{2.5}$ | Al$_2$O$_3$ | 87 | 30 | 4B | −101 |
| Example 10 | CuFe$_{0.25}$Al$_{0.25}$Mn$_{0.5}$O$_{2.5}$ | Al$_2$O$_3$ | 87 | 30 | 5B | −101 |
| Example 11 | CuGa$_{0.5}$B$_{0.5}$O$_{2.5}$ | Al$_2$O$_3$ | 84 | 30 | 4B | −102 |
| Comparative Example 4 | CuGa$_{0.5}$B$_{0.5}$O$_{2.5}$ | Al$_2$O$_3$ | 78 | 30 | 3B | −102 |
| Example 12 | CuFe$_{0.5}$B$_{0.5}$O$_{2.5}$ | Al$_2$O$_3$ | 86 | 30 | 4B | −101 |
| Comparative Example 5 | CuFe$_{0.5}$B$_{0.5}$O$_{2.5}$ | Al$_2$O$_3$ | 77 | 30 | 3B | −103 |
| Example 13 | CuNi$_{0.5}$B$_{0.5}$O$_{2.5}$ | Al$_2$O$_3$ | 81 | 30 | 4B | −104 |
| Example 14 | CuB$_{0.7}$O$_2$ | Al$_2$O$_3$ | 80 | 30 | 4B | −104 |
| Example 15 | NiMoO$_{3.8}$ | Al$_2$O$_3$ | 77 | 30 | 4B | −103 |
| Comparative Example 6 | NiMoO$_{3.8}$ | Al$_2$O$_3$ | 65 | 30 | 3B | −103 |
| Example 16 | NiMoO$_{3.8}$ | Al$_2$O$_3$ | 76 | 20 | 5B | −103 |
| Example 17 | TiO$_{0.9}$ | Al$_2$O$_3$ | 100 | 30 | 4B | −105 |
| Example 18 | TiO$_{0.9}$ | Al$_2$O$_3$ | 99 | 20 | 5B | −105 |
| Comparative Example 7 | TiO$_{0.9}$ | Al$_2$O$_3$ | 94 | 30 | 3B | −105 |
| Example 19 | TiO$_{1.67}$ | cement | 102 | 30 | 5B | −105 |
| Example 20 | CuO | Al$_2$O$_3$ | 99 | 30 | 4B | −105 |
| Comparative Example 8 | CuO | Al$_2$O$_3$ | 92 | 30 | 3B | −105 |
| Example 21 | Cu$_2$O | Al$_2$O$_3$ | 100 | 30 | 4B | −105 |
| Comparative Example 9 | Cu$_2$O | Al$_2$O$_3$ | 93 | 30 | 3B | −105 |
| Example 22 | CuO | ZrO$_2$ | 99 | 20 | 4B | −105 |
| Example 23 | CuO | ZrO$_2$ | 100 | 20 | 4B | −105 |
| Example 24 | Cu$_2$O | glass | 98 | 20 | 5B | −105 |
| Example 25 | Cu$_2$O | glass | 97 | 20 | 4B | −105 |
| Comparative Example 10 | Cu$_2$O | glass | 96 | 20 | 2B | −105 |
| Comparative Example 11 | CuO | ZrO$_2$ | 95 | 20 | 3B | −105 |
| Example 26 | CuO | ZrO$_2$ | 98 | 20 | 4B | −105 |
| Example 27 | CuO | ZrO$_2$ | 96 | 20 | 4B | −105 |
| Comparative Example 12 | Ag powder | Al$_2$O$_3$ | 95 | 30 | 4B | −100 |
| Example 28 | Ca$_{0.25}$Cu$_{0.75}$TiO$_{2.65}$ | ZrO$_2$ | 2.3 | 20 | 5B | −103 |
| Example 29 | NiMoO$_{3.5}$ | ZrO$_2$ | 1.7 | 20 | 5B | −103 |
| Example 30 | Cu$_2$O | ZrO$_2$ | 2.9 | 20 | 5B | −105 |
| Example 31 | CuO | ZrO$_2$ | 3.0 | 20 | 5B | −105 |

Although explanatory embodiments have been shown and described, it would be appreciated by those skilled in the art that the above embodiments may not be construed to limit the present disclosure, and changes, alternatives, and modifications may be made in the embodiments without departing from spirit, principles and scope of the present disclosure.

What is claimed is:

1. A method of metalizing a surface of an insulation substrate comprising:
    applying an ink composition onto the surface of the insulation substrate to be metalized to form an ink layer on the insulation substrate;
    subjecting the insulation substrate with the ink layer to heat treatment at a temperature of about 500 to 1000 degrees Celsius in a non-reactive atmosphere; and
    plating at least one metal layer on the ink layer;
    wherein the ink composition comprises a metal compound and an ink vehicle, and
    wherein the metal compound includes at least one selected from a group consisting of a nano-copper oxide, a nano-cuprous oxide, a compound of formula I, and a compound of formula II, $$TiO_{2-\sigma} \qquad (I),$$

$$M^1M^2_pO_q \qquad (II),$$

wherein 0.05≤σ<1.8, $M^1$ includes at least one element selected from a group consisting of groups 2, 9-12 of the periodic table according to IUPAC nomenclature, $M^2$ includes at least one element selected from a group consisting of groups 3-8, 10 and 13 of the periodic table according to IUPAC nomenclature, 0<p≤2, and 0<q<4.

2. The method according to claim 1, wherein the plating is performed by means of chemical plating or electrical plating.

3. The method according to claim 1, wherein the insulation substrate includes at least one selected from a group consisting of a glass substrate, a ceramic substrate, and a cement substrate.

4. The method according to claim 1, wherein based on 100 weight parts of the metal compound, the content of the ink vehicle is about 1 to 30 weight parts.

5. The method according to claim 1, wherein the metal compound has an average particle size of 1 to 500 nm.

6. The method according to claim 1, wherein the ink vehicle includes at least one selected from a group consisting of cellulose acetate, polyacrylate-based resin, ethylene-vinyl acetate copolymer, polyvinyl alcohol, polyvinyl acetal, polyvinyl acetate, polyvinyl pyrrolidone, and polyphosphonic acid.

7. The method according to claim 1, wherein the ink composition further comprises a solvent, wherein based on 100 weight parts of the metal compound, the content of the solvent is about 20 to 200 weight parts.

8. The method according to claim 1, wherein $M^1$ includes at least one selected from a group consisting of Mg, Ca, Sr, Ba, Co, Ni, Cu, Zn; and $M^2$ includes at least one selected from a group consisting of Sc, Y, Ti, Zr, Hf, V, Nb, Ta, Cr, Mo, W, Mn, Fe, Ru, B, Al, Ga, In.

9. The method according to claim 1, wherein $M^1$ includes one element selected from a group consisting of group 11 of the periodic table according to IUPAC nomenclature, and $M^2$ includes one element selected from a group consisting of group 8 of the periodic table according to IUPAC nomenclature.

10. The method according to claim 1, wherein $M^1$ includes one element selected from a group consisting of group 11 of the periodic table according to IUPAC nomenclature, and $M^2$ comprises $M^{21}$ and $M^{22}$, wherein $M^{21}$ includes one element selected from a group consisting of group 8 of the periodic table according to IUPAC nomenclature, $M^{22}$ includes at least one element selected from a group consisting of groups 13 and 7 of the periodic table according to IUPAC nomenclature, and a molar ratio between $M^{21}$ and $M^{22}$ is about 1:0.1-10.

11. The method according to claim 10, wherein $M^{22}$ comprises $M^{221}$ and $M^{222}$, wherein $M^{221}$ includes one element selected from a group consisting of group 13 of the periodic table according to IUPAC nomenclature, $M^{222}$ includes one element selected from a group consisting of group 7 of the periodic table according to IUPAC nomenclature, and a molar ratio between $M^{221}$ and $M^{222}$ is about 1:0.1-10.

12. The method according to claim 1, wherein $M^1$ includes one element selected from a group consisting of group 2 of the periodic table according to IUPAC nomenclature, and $M^2$ includes one element selected from a group consisting of group 13 of the periodic table according to IUPAC nomenclature.

13. The method according to claim 1, wherein $M^1$ includes one element selected from a group consisting of group 10 of the periodic table according to IUPAC nomenclature, and $M^2$ includes one element selected from a group consisting of group 6 of the periodic table according to IUPAC nomenclature.

14. The method according to claim 1, wherein $M^1$ includes one element selected from a group consisting of group 11 of the periodic table according to IUPAC nomenclature, and $M^2$ includes one element selected from a group consisting of group 13 of the periodic table according to IUPAC nomenclature, or $M^2$ comprises one element selected from a group consisting of group 13 of the periodic table according to IUPAC nomenclature and at least one element selected from a group consisting of groups 8 and 10 of the periodic table according to IUPAC nomenclature.

15. The method according to claim 14, wherein $M^2$ comprises $M^{23}$ and $M^{24}$, wherein $M^{23}$ includes at least one element selected from a group consisting of groups 8, 10 and 13 of the periodic table according to IUPAC nomenclature, $M^{24}$ includes B, $M^{23}$ and $M^{24}$ are different, and a molar ratio of $M^{23}$ and $M^{24}$ is about 1:0.1-10.

16. The method according to claim 1, wherein the metal compound includes at least one selected from a nano-copper oxide, a nano-cuprous oxide, a compound of formula I, a compound of formula III, $CuFe_{0.5}Mn_{0.5}O_{2.5}$, $CuFe_{0.5}Al_{0.5}O_{2.5}$, $CuFe_{0.5}Al_{0.25}Mn_{0.5}O_{2.5}$, a compound of formula IV, a compound of formula V, $CuFe_{0.5}B_{0.5}O_{2.5}$, $CuNi_{0.5}B_{0.5}O_{2.5}$, $CuGa_{0.5}B_{0.5}O_{2.5}$, $CuB_{0.7}O_2$, and a compound of formula VI, $CuFeO_{4-\sigma}$ (III), $MgGa_2O_{4-\lambda}$ (IV), $NiMoO_{4-\mu}$ (V), $Ca_\alpha Cu_{1-\alpha} TiO_{3-\beta}$ (VI), wherein 0<δ≤3, 0<λ≤3, 0<μ≤3, 0≤α<1 and β is about 0-2.

17. The method according to claim 1, wherein the insulation substrate with the ink layer is subjected to heat treatment at about 700 to 900 degrees Celsius.

18. The method according to claim 1, wherein the ink layer has a thickness of about 8 to 50 microns.

19. The method according to claim 1, wherein applying the ink composition onto the surface to be metalized further comprises:

mixing the ink composition with an inorganic binder to form a mixture; and applying the mixture onto the surface to be metalized;

wherein based on 100 weight parts of the ink composition, the amount of the inorganic binder is about 1 to 15 weight parts.

20. The method according to claim 19, wherein the inorganic binder includes at least one selected from a group consisting of $SiO_2$, CaO, $Na_2O$, ZnO and $Ni_2O_3$.

* * * * *